(12) United States Patent
Kikkawa (10) Patent No.: US 7,893,709 B2
(45) Date of Patent: Feb. 22, 2011

(54) TERMINATION CIRCUIT

(75) Inventor: Yukinobu Kikkawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 13 days.

(21) Appl. No.: 12/314,583

(22) Filed: Dec. 12, 2008

(65) Prior Publication Data

US 2009/0160480 A1     Jun. 25, 2009

(30) Foreign Application Priority Data

Dec. 20, 2007    (JP)    ............... 2007-328914

(51) Int. Cl.
*H03K 19/003*    (2006.01)

(52) U.S. Cl. ............... 326/30; 326/86; 326/21; 326/83; 327/108; 327/109; 327/112

(58) Field of Classification Search ........... 326/30, 326/86, 26, 27; 327/108, 112
See application file for complete search history.

(56) References Cited

U.S. PATENT DOCUMENTS

| | | | | |
|---|---|---|---|---|
| 5,877,634 | A * | 3/1999 | Hunley | ............... 326/83 |
| 6,087,847 | A * | 7/2000 | Mooney et al. | ............... 326/30 |
| 6,489,837 | B2 * | 12/2002 | Schultz et al. | ............... 327/541 |
| 6,853,213 | B2 * | 2/2005 | Funaba | ............... 326/30 |
| 6,854,164 | B2 * | 2/2005 | Bass et al. | ............... 24/136 R |
| 7,038,486 | B2 * | 5/2006 | Aoyama et al. | ............... 326/30 |
| 7,038,498 | B2 * | 5/2006 | Funaba | ............... 327/77 |
| 7,068,065 | B1 * | 6/2006 | Nasrullah | ............... 326/30 |
| 7,514,955 | B2 * | 4/2009 | Kim | ............... 326/30 |
| 2004/0251940 | A1 | 12/2004 | Hayashi et al. | |
| 2006/0022701 | A1 | 2/2006 | Tokuhiro et al. | |
| 2006/0255842 | A1 | 11/2006 | Hayashi et al. | |
| 2008/0211548 | A1 | 9/2008 | Hayashi et al. | |

FOREIGN PATENT DOCUMENTS

| | | |
|---|---|---|
| JP | 2004-327602 | 11/2004 |
| JP | 2006-42136 | 2/2006 |

* cited by examiner

*Primary Examiner*—Vibol Tan
(74) *Attorney, Agent, or Firm*—McGinn Intellectual Property Law Group Law, PLLC (57) ABSTRACT

In order to prevent malfunction due to fluctuations in signal level, a terminating resistor circuit includes terminating resistors the connections whereof to an input/output terminal are capable of being turned on and off, whereby a Thevenin termination is formed. A control circuit exercises control so as to temporally stagger on/off timings of respective ones of the terminating resistors.

11 Claims, 8 Drawing Sheets

TERMINATION CIRCUIT

FIELD OF THE INVENTION

Reference to Related Application

This application is based upon and claims the benefit of the priority of Japanese patent application No. 2007-328914 filed on Dec. 20, 2007, the disclosure of which is incorporated herein in its entirety by reference thereto.

This invention relates to a termination circuit and, more particularly, a termination circuit having terminating resistors for impedance matching with a transmission line.

BACKGROUND

In the transmission of data between a memory and a CPU, etc., impedance matching in the transmission line is required in cases where transmission is performed at high speeds. An interface of a memory compliant with DDR2 (Double Data Rate 2) established by the JEDEC (Joint Electron Device Engineering Council) is required to have a termination circuit on the controller side of the memory. If we assume that the impedance of the transmission line is 75Ω in this case, the terminating resistance value will be 75Ω if the controller and memory are connected 1:1. On the other hand, if controller and memory are connected 1:2, it is required to so arrange it that the terminating resistance value can be changed over to 150Ω. Furthermore, the termination circuit is required to have a Thevenin termination.

A termination circuit forms a Thevenin termination by providing a resistance unit between the transmission line and power supply line and between the transmission line and ground line so as to achieve impedance matching with the transmission line, and the termination circuit is provided in association with input/output buffer(s). Further, in order to achieve impedance matching with a transmission line, the terminating resistance value is set to a suitable value in accordance with conditions. As such as example, Patent Document 1 discloses a termination circuit having a resistance unit formed by connecting a pair of a P-channel MOS transistor and an N-channel MOS transistor in parallel, wherein a Thevenin termination is formed by providing a resistance unit between the transmission line and a power supply line and between the transmission line and a ground line. In accordance with this termination circuit, it is possible to improve the matching characteristic of a transmission line using transistors as terminating resistors.

As related art, Patent Document 2 discloses a semiconductor integrated circuit device in which an output circuit has a plurality of parallel-configured output MOSFETs, output impedance is adjusted by a first control means which selects a number of the plurality of output MOSFETs that are turned on, and slew rate is adjusted by a second control means by adjusting drive signals of the output MOSFETs which are turned on. In accordance with this semiconductor integrated circuit device, it is possible to set adjustment of impedance and adjustment of slew rate mutually independently, thereby simplifying the configuration of the adjustment circuitry.

[Patent Document 1] Japanese Patent Kokai Publication JP-2006-42136A

[Patent Document 2] Japanese Patent Kokai Publication JP-2004-327602A

The entire disclosures in the above-mentioned Patent Documents are incorporated herein by reference thereto.

The analysis set forth below is given in the present invention.

SUMMARY OF THE DISCLOSURE

In the circuit described in Patent Document 1, the on/off action of the resistance units constituting the Thevenin terminating resistors are controlled simultaneously by on/off signal lines. In a system constituted by multiple bits such as a memory interface, the number of I/O buffers that operate simultaneously increases and this is accompanied by a large number of Thevenin terminations being turned on/off simultaneously when a changeover is made to an input mode that will be on the data-receive side or when a changeover is made to an output mode that will be on the data-transmit side. Consequently, when the changeover is made to the input mode, the Thevenin terminating resistors are turned on simultaneously and a large current starts to flow instantaneously between the power supply and ground. When the changeover is made to the output mode, the Thevenin terminating resistors are turned off simultaneously and the large current that was flowing between the power supply and ground halts instantaneously.

These sudden changes in current produce noise by causing a voltage fluctuation ascribable to an inductance component in the package or wiring, etc., of a semiconductor device. Voltage fluctuation $\Delta V$ is represented by the equation $\Delta V = L \times di/dt$, where $di/dt$ represents a change in current per unit time and L denotes inductance. That is, the greater the change in current when a terminating resistor is turned on and off, the larger the fluctuation, and this produces a swing in the potentials of the power supply, ground and data signal.

When the changeover is made to the input mode, the signal level that has thus fluctuated is incorporated and there is a danger that this will cause a system malfunction. When the changeover is made to the output mode, the output signal level fluctuates and there is a danger that this will cause a malfunction in signal transmission. Therefore, there is much to be desired in the art.

According to a first aspect of the present invention, there is provided a termination circuit which comprises: an external connection terminal; a terminating resistor circuit that includes a plurality of resistance elements the connections whereof to the external connection terminal are capable of being turned on and off; and a control circuit. The control circuit exercises control so as to temporally stagger on/off timings of respective ones of the plurality of resistance elements.

Meritorious effects include at least as follows:

In accordance with the present invention, by controlling the on/off timings of respective ones of the plurality of resistance elements, it is possible to suppress a sudden change in current when the terminating resistors are turned on/off.

Other features and advantages of the present invention will be apparent from the following description taken in conjunction with the accompanying drawings, in which like reference characters designate the same or similar parts throughout the figures thereof.

DESCRIPTION OF THE PREFERRED MODES

A termination circuit according to the present invention includes an external terminal, a terminating resistor circuit and a control circuit. The terminating resistor circuit includes a plurality of resistance elements the connections whereof to the external connection terminal are capable of being turned on and off, thereby forming a Thevenin termination. The control circuit exercises control so as to temporally stagger on/off timings of respective ones of the plurality of resistance elements.

The termination circuit of the present invention may be provided with a plurality of transistors for turning the connections of the plurality of resistance elements to the external terminal on and off.

In the termination circuit of the present invention, the control circuit may be so adapted as to control the timings of respective ones of the plurality of transistors by delaying the operation of respective ones of the transistors.

In the termination circuit of the present invention, the control circuit may be so adapted as to control the timings of respective ones of the plurality of transistors by changing slew rates of respective ones of control signals supplied to the plurality of transistors.

In the termination circuit of the present invention, the control circuit may have driving circuits, each of which includes a plurality of driving transistors, for driving respective ones of the plurality of transistors, wherein each driving circuit may be so adapted as to vary slew rate by changing the number of the plurality of driving circuits that are activated.

The present invention further provides a buffer circuit equipped with terminating resistors, the buffer comprising: the above-described termination circuit and an input circuit, output circuit or input/output circuit connected to the external connection terminal, wherein the control circuit is so adapted as to output an enable signal to the input circuit, output circuit or input/output circuit after on/off control in each of the plurality of resistance elements is completed.

The present invention further provides a semiconductor integrated circuit device having the above-described termination circuit or buffer circuit equipped with terminating resistors.

Exemplary embodiments of the present invention will now be described in detail with reference to the accompanying drawings.

First Exemplary Embodiment

Figure 1:
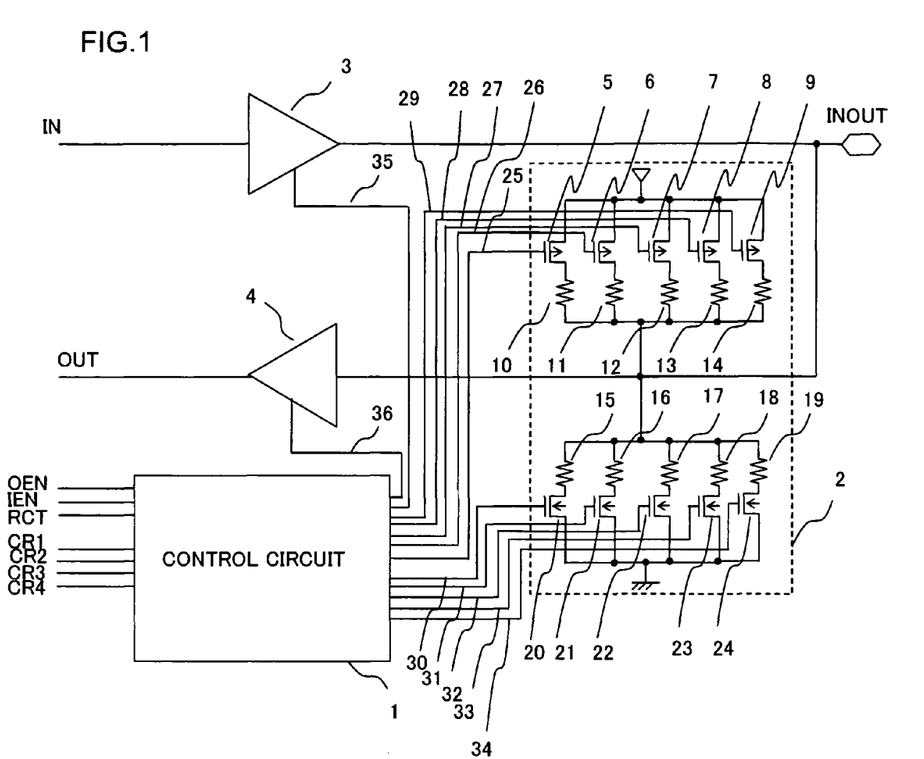
FIG. 1 is a diagram illustrating the configuration of a termination circuit according to a first exemplary embodiment of the present invention.

FIG. 1 is a diagram illustrating the configuration of a termination circuit according to a first exemplary embodiment of the present invention. As shown in FIG. 1, the termination circuit includes a control circuit 1, a terminating resistor circuit 2, an output buffer 3, an input buffer 4 and an input/output terminal INOUT which may acts as an external connection terminal.

The control circuit 1 controls the on/off timings of respective resistance elements in the terminating resistor circuit 2 and controls the activation of the output buffer 3 and input buffer 4. The terminating resistor circuit 2 is connected to the input/output terminal INOUT and forms a terminating resistor (arrangement) termed as "Thevenin termination". The resistance value of the terminating resistor can be varied by the control circuit 1. The output buffer 3 buffers a signal IN from an internal circuit and outputs this signal to the input/output terminal INOUT. The input buffer 4 buffers the signal at the input/output terminal INOUT and outputs this signal to the internal circuit as a signal OUT.

The terminating resistor circuit 2 is composed of a plurality of divided resistors, in which terminating resistors 10 to 14 and P-type transistors 5 to 9 for turning respective ones of these terminating resistors on and off are connected between the side of a power supply and the input/output terminal INOUT. Further, terminating resistors 15 to 19 and N-type transistors 20 to 24 for turning respective ones of these terminating resistors on and off are connected between the side of ground and the input/output terminal INOUT.

The inputs to the control circuit 1 are an input enable signal IEN to the input buffer 4, an output enable signal OEN to the output buffer 3, a control signal RCT for turning terminating resistors on and off, and terminating-resistor selection signals CR1 to CR4. The control circuit 1 outputs an output enable signal 35 as a control signal of the output buffer 3, and outputs an input enable signal 36 as a control signal of the input buffer 4. The input enable signal IEN, output enable signal OEN, control signal RCT and terminating-resistor selection signals CR1 to CR4 are supplied from a separate control channel or channels within the chip. In particular, the terminating-resistor selection signals CR1 to CR4 are selection signals that are output from an impedance adjustment macro. Further, the terminating-resistor selection signals CR1 to CR4 are signals that are fixed after being controlled and decided at the time of initialization.

The control circuit 1 supplies signals 25 to 29, which turn the respective terminating resistors 10 to 14 on the power-supply side on and off, to the gates of the P-type transistors 5 to 9, respectively. The control circuit 1 further supplies signals 30 to 34, which turn the respective terminating resistors 15 to 19 on the ground side on and off, to the gates of the NP-type transistors 20 to 24, respectively.

Figure 2:
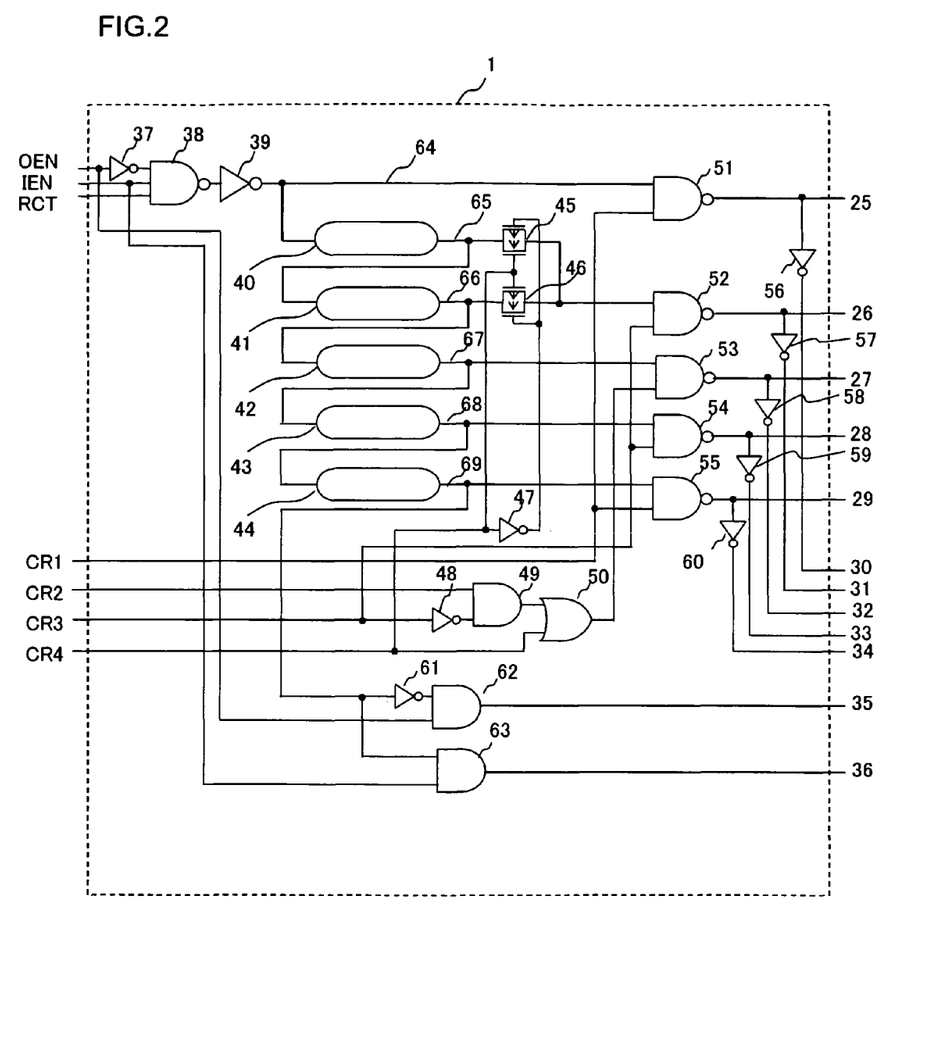
FIG. 2 is a circuit diagram of a control circuit according to the first exemplary embodiment.

FIG. 2 is a circuit diagram of the control circuit 1 according to the first exemplary embodiment of the present invention. As shown in FIG. 2, the control circuit 1 includes inverters 37, 39, 47, 48 and 56 to 61, a 3-input NAND gate 38, 2-input NAND circuits 51 to 55, delay circuits 40 to 44, 2-input AND gates 49, 62 and 63, a 2-input OR gate 50 and transfer gates 45, 46.

The output of the inverter 37 whose input is the output enable signal OEN, the input enable signal IEN and the control signal RCT are input to the NAND gate 38, which proceeds to find the logical product and connect its output to a node 64 via the inverter 39. The delay circuits 40 to 44, which successively delay the signal at the node 64, are connected in cascade.

The transfer gates 45 and 46 select exclusively a node 65, which is the output of the delay circuit 40, and a node 66, which is the output of the delay circuit 41. The node 65 is connected to the input of the delay circuit 41 and to one end of the transfer gate 45. The node 66 is connected to the input of the delay circuit 42 and to one end of the transfer gate 46. The other ends of the transfer gates 45 and 46 are tied together and connected to one input of the NAND circuit 52. The resistor selection signal CR4 is supplied to an Nch gate of the transfer gate 45 and to a Pch gate of the transfer gate 46, and the output of the inverter 47, the input to which is the resistor selection signal CR4, is connected to the Pch gate of the transfer gate 45 and to the Nch gate of the transfer gate 46.

The AND gate 49 receives at one input the resistor selection signal CR2, receives at the other input the output of the inverter 48 whose input is the resistor selection signal CR3, and connects its output to one input of the OR gate 50. The resistor selection signal CR4 is input to the other input of the OR gate 50, which connects its output to the other input of the NAND circuit 53.

The node 64 is connected to one input of the NAND circuit 51, the resistor selection signal CR1 is connected to the other input, and the NAND gate 51 connects its output to a node 25. The other ends of the transfer gates 45 and 46 are connected to one input of the NAND gate 52, the resistor selection signal CR3 is input to the other input, and the NAND gate 52 connects its output to a node 26. A node 67, which is the output of the delay circuit 42, is connected to one input of the NAND gate 53, the other input is connected the output of the OR gate 50, and the output of the NAND gate 53 to a node 27. A node 68, which is the output of the delay circuit 43, is connected to one input of the NAND gate 54, the resistor selection signal CR3 is applied to the other input, and the output of the NAND gate 54 is connected to a node 28. A node 69, which is the output of the delay circuit 44, is connected to one input of the NAND gate 55, the resistor selection signal CR1 is applied to the other input, and the NAND gate 54 connects its output to a node 29.

The inverter 56 has its input and output connected to the node 25 and to a node 30, respectively. The inverter 57 has its input and output connected to the node 26 and to a node 31, respectively. The inverter 58 has its input and output connected to the node 27 and to a node 32, respectively. The inverter 59 has its input and output connected to the node 28 and to a node 33, respectively. The inverter 60 has its input and output connected to the node 29 and to a node 34, respectively.

The output of the inverter 61 whose input is the node 69 is connected to one input of the AND gate 62, the output enable signal OEN is applied to the other input, and the AND gate 62 outputs the output enable signal 35. The node is connected to one input of the AND gate 63, the input enable signal IEN is applied to the other input and the NAND gate 63 outputs the input enable signal 36.

Figure 3:
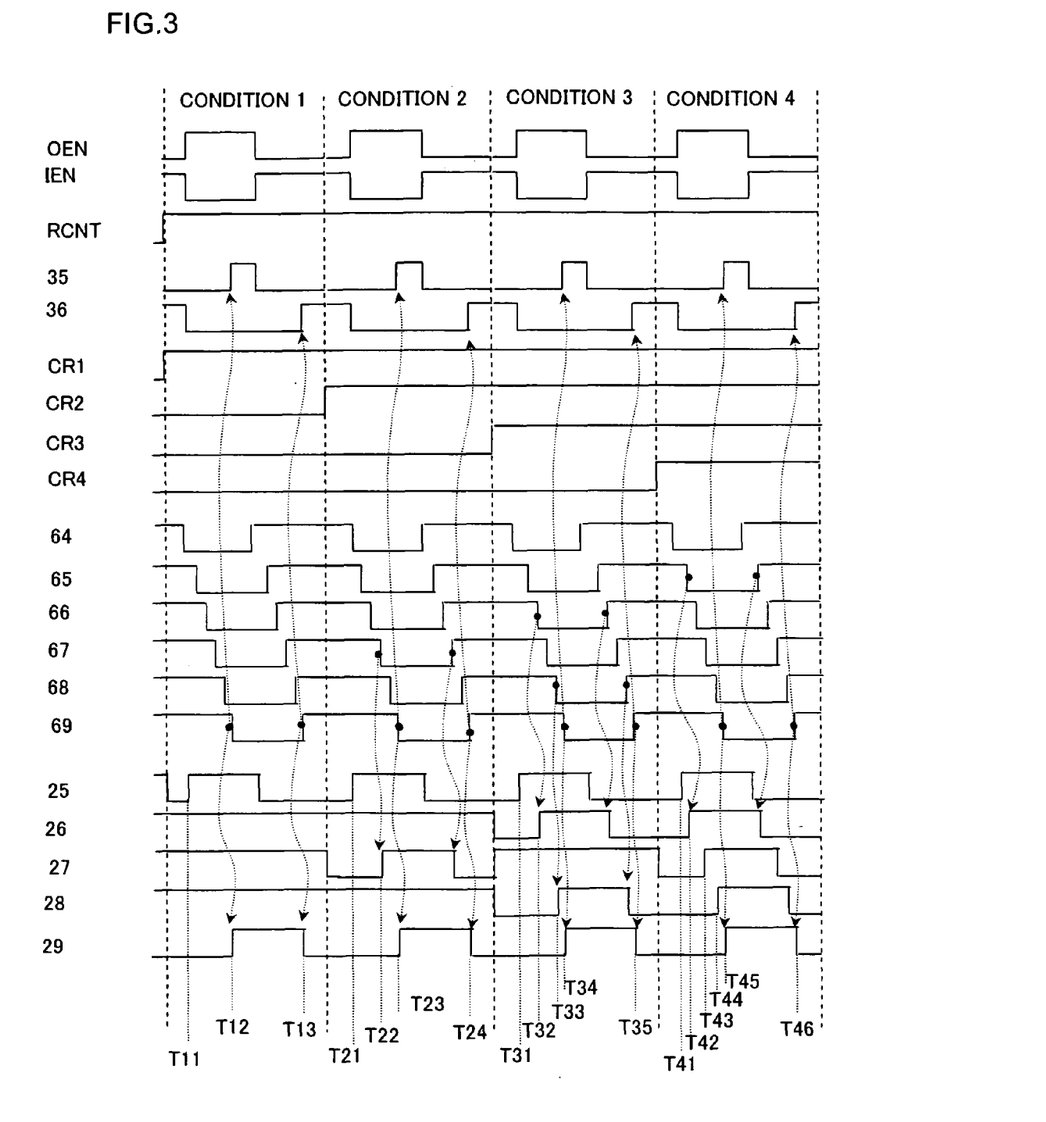
FIG. 3 is a timing chart illustrating operation of the control circuit according to the first exemplary embodiment.

FIG. 3 is a timing chart illustrating operation of the control circuit according to the first exemplary embodiment. Conditions 1, 2, 3 and 4 in FIG. 3 indicate cases where the numbers of terminating resistors 10, 11, 12, 13 and 15, 16, 17, 18, 19 selected differ from condition to condition. Resistors selected as terminating resistors are decided by the resistor selection signals CR1, CR2, CR3, CR4, which effect control to the desired terminating resistance value, and are selected by the on/off operation of respective p-type transistors 5, 6, 7, 8, 9 based upon the signals at the respective nodes 25, 26, 27, 28, 29 output from the control circuit 1. Further, resistors selected as terminating resistors are selected by the on/off operation of respective n-type transistors 20, 21, 22, 23, 24 based upon the signals at the respective nodes 30, 31, 32, 33, 34.

In the timing chart of FIG. 3, the conditions 1, 2, 3, 4 represent conditions in which the number of resistors used in order to realize a desired resistance value is changed in a case where there has been a fluctuation in resistance owing to manufacturing conditions or condition of power supply voltage or temperature at the time of use. After control has been exercised to obtain the desired resistance value, the number of resistors selected is kept fixed as long as circumstances at the time of use do not fluctuate. In order to describe operation under each condition in FIG. 3, the conditions 1, 2, 3, 4 are indicated as being successive in terms of time for the sake of convenience. In actual operation, however, the transition of the conditions is not necessarily in the order of conditions 1, 2, 3, 4.

Under condition 1, CR1="H", CR2="L", CR3="L", CR4="L" holds and NAND gates 51, 55 among the NAND gates 51 to 55 in FIG. 2 are activated owing to these resistor selection signals. Accordingly, the signal at node 64 produced by the input signals OEN, IEN, RCT and the signal at node 69 produced by the delay circuits 40, 41, 42, 43, 44 are received and the node 25 is activated at time T11 after node 64 changes. Further, node 29 is activated at time T12 delayed by the delay circuits 40, 41, 42, 43, 44. At the same time, the signals at node 30, 34 are the result of the signals at nodes 25, 29 being inverted and output by the inverters 56, 60, respectively.

Thus, under condition 1, when the output mode is in effect (OEN="H"), the P-type transistor 5 and N-type transistor 20 in FIG. 1 turn off and the terminating resistors 10 and 15 are deactivated at time T11 indicated in the timing chart of FIG. 3. Next, at time T12, the P-type transistor 9 and N-type transistor 24 turn off and the terminating resistors 14 and 19 are deactivated. In other words, terminating resistors 10, 15 turn off at time T11. At time T12, terminating resistors 14, 19 turn off and all terminating resistors turn off.

The timings at which the terminating resistors are activated when the input mode (IEN="H") is in effect change in the same manner as the timings at which the terminating resistors are deactivated. That is, signals similarly are output at the nodes 25, 29 and 30, 34 owing to signals generated by the input signals OEN, IEN, RCT, and the P-type transistor group and N-type transistor group turn on at timings similar to the timings at which P-type transistor group and N-type transistor group turn off. First, terminating resistors 10 and 15 turn on, then terminating resistors 14 and 19 turn on, as a result of which the desired terminating resistors under condition 1 are turned on.

Under condition 2, CR1="H", CR2="H", CR3="L", CR4="L" holds and NAND gates 51, 53, 55 among the NAND gates 51 to 55 in FIG. 2 are activated owing to these resistor selection signals. Accordingly, in a manner similar to that of condition 1, the P-type transistor 5 and N-type transistor 20 in FIG. 1 turn off and the terminating resistors 10 and 15 are deactivated at time T21. Next, at time T22, the P-type transistor 7 and N-type transistor 22 turn off and the terminating resistors 12 and 17 are deactivated. Next, at time T23, the P-type transistor 9 and N-type transistor 24 turn off and the terminating resistors 14 and 19 are deactivated. Further, the timings at which the terminating resistors are activated also change in a manner similar to the timings at which the terminating resistors are deactivated.

Under condition 3, CR1="H", CR2="H", CR3="H", CR4="L" holds and NAND gates 51, 52, 54, 55 among the NAND gates 51 to 55 in FIG. 2 are activated owing to these resistor selection signals. Accordingly, in a manner similar to that of condition 1, the P-type transistor 5 and N-type transistor 20 in FIG. 1 turn off and the terminating resistors 10 and 15 are deactivated at time T31. Next, at time T32, the P-type transistor 6 and N-type transistor 21 turn off and the terminating resistors 11 and 16 are deactivated. Next, at time T33, the P-type transistor 8 and N-type transistor 23 turn off and the terminating resistors 13 and 18 are deactivated. Next, at time T34, the P-type transistor 9 and N-type transistor 24 turn off and the terminating resistors 14 and 19 are deactivated. Further, the timings at which the terminating resistors are activated also change in a manner similar to the timings at which the terminating resistors are deactivated.

Under condition 4, CR1="H", CR2="H", CR3="H", CR4="H" holds and NAND gates 51, 52, 53, 54, 55 in FIG. 2 are activated owing to these resistor selection signals. Accordingly, in a manner similar to that of condition 1, the P-type transistor 5 and N-type transistor 20 in FIG. 1 turn off and the terminating resistors 10 and 15 are deactivated at time T41. Next, at time T42, the P-type transistor 6 and N-type transistor 21 turn off and the terminating resistors 11 and 16 are deactivated. Next, at time T43, the P-type transistor 7 and N-type transistor 22 turn off and the terminating resistors 12 and 17 are deactivated. Next, at time T44, the P-type transistor 8 and N-type transistor 23 turn off and the terminating resistors 13 and 18 are deactivated. Next, at time T45, the P-type transistor 9 and N-type transistor 24 turn off and the terminating resistors 14 and 19 are deactivated. Further, the timings at which the terminating resistors are activated also change in a manner similar to the timings at which the terminating resistors are deactivated.

Further, the output enable signal 35 attains the "H" level so as to turn on the output buffer 4 after the final resistor of the terminating resistor group is deactivated (times T12, T23, T34, T45) under each of the conditions. The enable signal 36 attains the "H" level so as to turn on the output buffer 3 after the final terminating resistor of the terminating resistor group is activated (times T13, T24, T35, T46) under each of the conditions.

Thus, the timings at which the resistance elements 10 to 14 and 15 to 19 turn on are decided by the delay elements 44 to 44, and which resistors are turned on is decided in accordance with the number of resistors that have been selected. For example, in relation to the timing at which signal 26 changes, time T32 in condition 3 is set by the time produced by delay circuits 40, 41, and T42 in condition 4 is set by the time produced by delay circuit 40. An advantage obtained by thus setting time is that current variation is dispersed.

Thus, as for the timings at which the terminating resistor groups are turned on, the terminating resistors are turned on gradually, within a fixed period of time until a changeover is made to the input mode, in accordance with the state selected by the resistor selection signals, whereby a current variation produced when terminating resistors are turned on can be suppressed. Similarly, as for the timings at which the terminating resistor groups are turned off, the terminating resistors are turned off gradually, within a fixed period of time until a changeover is made to the output mode, in accordance with the state selected by the resistor selection signals, whereby a current variation produced when terminating resistors are turned off can be suppressed.

The resistor selection signals CR1, CR2, CR3, CR4 are set to effect control to the desired terminating resistance value even in a case where there is a variation in the resistors within the terminating resistor circuit and in the performance of the switching transistors. In a case where a resistance value is low and the performance of a switching transistor is high, a desired terminating resistance value can be obtained by a small number of terminating resistors within the parallel-connected terminating resistor groups. On the other hand, in a case where a resistance value is high and the performance of a switching transistor is low, it is necessary to activate a plurality of terminating resistors and the resistor selection signals CR1, CR2, CR3, CR4 are set accordingly. That is, condition 1 in FIG. 3 is an example of a case where a resistance value is low and the performance of a switching transistor is high, and condition 4 is an example of a case where a resistance value is high and the performance of a switching transistor is low.

Further, as for the relationship between number of selected terminating resistors and current that flows through one terminating resistor, a small number of terminating resistors are selected in a case where resistance value is low and performance of the switching transistor is high. In this case, the current that flows through one terminating resistor is comparatively large and the speed of the circuit that turns this on increases. Conversely, in a case where the resistance value is high and the performance of the switching transistor is low, a plurality of terminating resistors are selected. In this case, the current that flows through one terminating resistor is comparatively small and the speed of the circuit that turns this on decreases.

Therefore, in the case of condition 1, the current variation is dispersed by dividing the timing at which the two terminating resistor groups are turned on and off by the times T11, T12 in such a manner that the current variation will occur evenly within a fixed period of time until the changeover to the input or output mode. Further, in the case of condition 4, the current variation is dispersed by dividing the timing at which the five terminating resistor groups are turned on and off by the times T41, T42, T43, T44, T45, whereby the amount of variation in current can be kept small. In the case of condition 4, the number of times current changes is large. However, the amount of change in current in the case where one terminating resistor is turned on and off is smaller for condition 4 than for condition 1 and therefore the amount of change in current over a fixed period of time is the same in both conditions 1 and 4.

By similarly dispersing the timings at which the terminating resistor groups are turned on and off in conditions 2 and 3, it is possible to suppress the amount of change in current within a fixed period of time up to changeover to the input or output mode.

Figure 4:
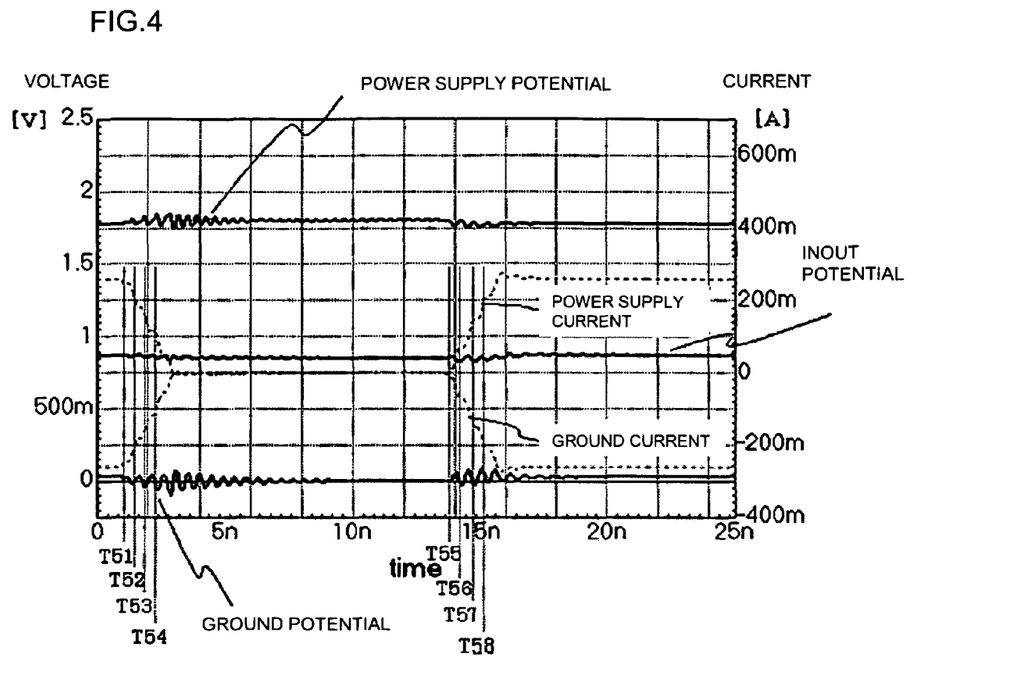
FIG. 4 is a diagram illustrating voltage and current waveforms of various portions of the termination circuit.

FIG. 4 is a diagram illustrating voltage and current waveforms of various portions of the termination circuit. FIG. 4 illustrates an example of operation under condition 3 in the timing chart of FIG. 3.

When the input mode is in effect, four transistors on the power supply side and four transistors on the ground side are turned on to form a Thevenin termination. When there is a changeover from the input mode to the output mode, first resistors (terminating resistors 10, 15) on the power supply side and ground side are turned off at time T51, second resistors (terminating resistors 11, 16) on the power supply side and ground side are turned off at time T52, third resistors (terminating resistors 13, 18) on the power supply side and ground side are turned off at time T53, and fourth resistors (terminating resistors 14, 19) on the power supply side and ground side are turned off at time T54. As a result, power supply current and ground current when the resistors are turned off gradually cease to flow and the change in current is small, and therefore swings in power supply potential and ground potential are kept small.

Further, when there is a changeover from the output mode to the input mode, first resistors (terminating resistors 10, 15) on the power supply side and ground side are turned on at time T55, second resistors (terminating resistors 11, 16) on the power supply side and ground side are turned on at time T56, third resistors (terminating resistors 13, 18) on the power supply side and ground side are turned on at time T57, and fourth resistors (terminating resistors 14, 19) on the power supply side and ground side are turned on at time T58. Four transistors on the power supply side and four transistors on the ground side are turned on one after another and the power supply current and ground current gradually increase. Since the change in current is small, however, a swing in the ground potential also is kept small.

By thus suppressing a change in power supply current and ground current, fluctuations in power supply potential, ground potential and INOUT potential ascribable to an inductance component decline and the occurrence of noise can be suppressed.

In accordance with the termination circuit set forth above, it is possible to reduce the cause of malfunction ascribable to incorporation of a fluctuating signal level when there is a changeover to the input mode. Further, it is possible to reduce the cause of malfunction in a transmission line ascribable to fluctuation of output signal level when there is a changeover to the output mode.

Second Exemplary Embodiment

Figure 5:
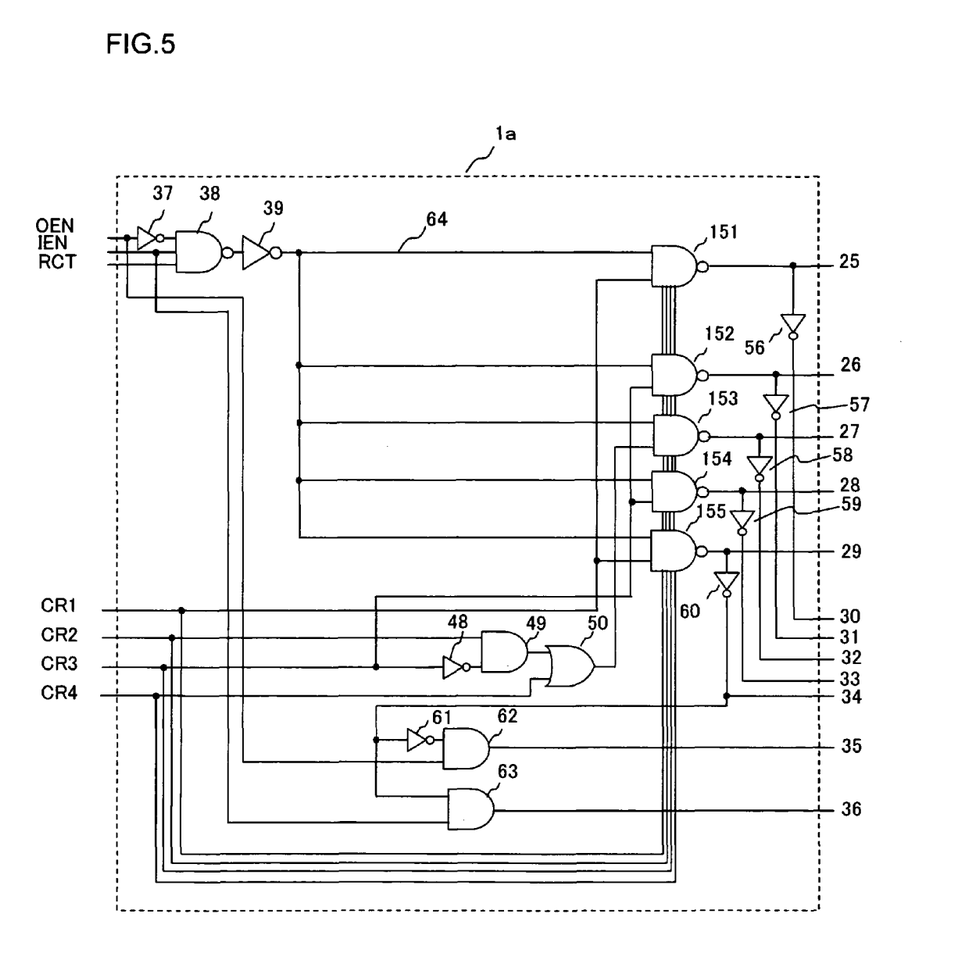
FIG. 5 is a circuit diagram of a control circuit according to a second exemplary embodiment of the present invention.

FIG. 5 is a circuit diagram of a control circuit according to a second exemplary embodiment of the present invention. Components in FIG. 5 identical with those shown in FIG. 2 are designated by like reference characters. A control circuit 1a in FIG. 5 differs from the control circuit 1 of FIG. 2 in that the delay circuits 40, 41, 42, 43, 44, transfer gates 45, 46 and inverter 47 are deleted, the delay circuits 40, 41, 42, 43, 44 and transfer gate 46 are short-circuited and NAND circuits 151 to 155 are provided in place of the NAND circuits 51 to 55. Further, the connection destination of the input of the inverter 61 and of one input of the AND gate 63 is changed from node 69 to node 34.

The resistor selection signals CR1, CR2, CR3, CR4 are input to the NAND circuits 151 to 155 as control signals, and the NAND circuits 151 to 155 are capable of varying slew rate of a (preceding) circuit that turns the terminating resistors on and off in accordance with the states of the resistor selection signals CR1, CR2, CR3, CR4.

Figure 6:
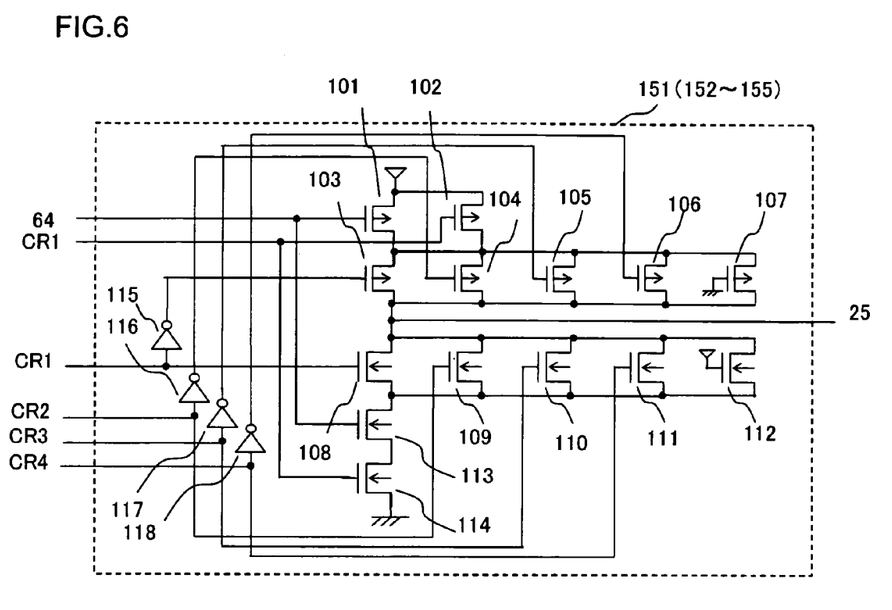
FIG. 6 is an example of a NAND circuit.

FIG. 6 is an example of the NAND circuit 151. It should be noted that the NAND circuits 152 to 155 are similarly constructed to the NAND circuit 151. The logical operation of the NAND circuit 151 is the same as that of the NAND gate 51 in FIG. 1. It is so arranged that the number of operations of transistors connected to the drain side can be varied in accordance with the states of the resistor selection signals CR1, CR2, CR3, CR4, and the slew rate of the output can be varied by the number of transistor operations.

The NAND circuit 151 has P-type transistors 101 to 107, N-type transistors 108 to 114 and inverters 115 to 118. The P-type transistors 101, 102 have sources connected to the power supply and drains connected to the sources of the P-type transistors 103 to 107. The gate of the P-type transistor 101 is connected to node 64. The resistor selection signal CR1 is input to the gate of the P-type transistor 102. The N-type transistor 113 has a source connected to the drain of the N-type transistor 114, a drain connected to the sources of the N-type transistors 108 to 112, and a gate connected to the node 64. The N-type transistor 114 has a source connected to ground and a gate connected to the node 64. The drains of the P-type transistors 103 to 107 and the drains of the N-type transistors 108 to 112 are tied together and output the signal 25. A 2-input NAND circuit is constructed by the P-type transistors 101, 102 and by the N-type transistors 113, 114.

The output of the inverter 115, the input of which is the resistor selection signal CR1, is input to the gate of the P-type transistor 103, and the resistor selection signal CR1 is input to the gate of the N-type transistor 108. The output of the inverter 116, the input of which is the resistor selection signal CR2, is input to the gate of the P-type transistor 104, and the resistor selection signal CR2 is input to the gate of the N-type transistor 109. The output of the inverter 117, the input of which is the resistor selection signal CR3, is input to the gate of the P-type transistor 105, and the resistor selection signal CR3 is input to the gate of the N-type transistor 110. The output of the inverter 118, the input of which is the resistor selection signal CR4, is input to the gate of the P-type transistor 106, and the resistor selection signal CR4 is input to the gate of the N-type transistor 111. The gate of the P-type transistor 107 is grounded and the gate of the N-type transistor 112 is connected to the power supply.

The P-type transistor 103 and N-type transistor 108 turn on when CR1="H" holds, the P-type transistor 104 and N-type transistor 109 turn on when CR2="H" holds, the P-type transistor 105 and N-type transistor 110 turn on when CR3="H" holds, and the P-type transistor 106 and N-type transistor 111 turn on when CR4="H" holds. The P-type transistor 107 and N-type transistor 112 are always on.

It should be noted that in the NAND circuits 151 to 155, the numbers of stages of the portions corresponding to the P-type transistors 103 to 107 and N-type transistors 108 to 112 may be made different and the timings of the respective signals 25 to 29 may be staggered.

The NAND circuit 151 that operates in this manner varies the slew rate of the signal 25, which is an output, in accordance with the states of the resistor selection signals CR1, CR2, CR3, CR4.

Figure 7:
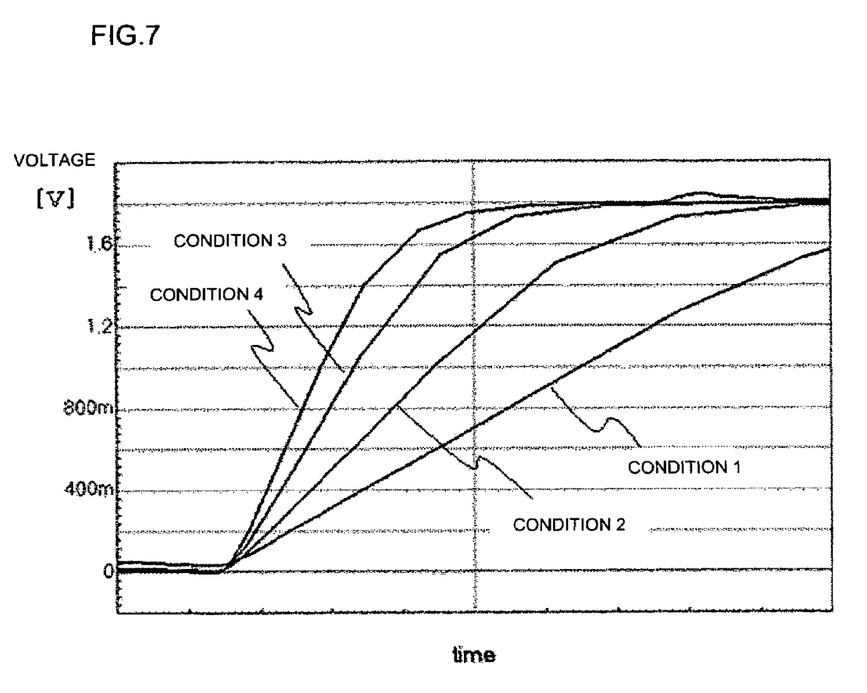
FIG. 7 is a diagram illustrating an example of operating waveforms of a signal 25.

FIG. 7 is a diagram illustrating an example of operating waveforms of the signal 25. In a manner similar to the first exemplary embodiment, the conditions 1, 2, 3, 4 represent conditions in which the number of resistors used in order to realize a desired resistance value have been changed in a case where there has been a fluctuation in resistance owing to manufacturing conditions or condition of power supply voltage or temperature at the time of use. Condition 1 is an example of a case where a resistance value is low and the performance of a switching transistor is high, and condition 4 is an example of a case where a resistance value is high and the performance of a switching transistor is low. Slew rate of the signal 25 illustrated in FIG. 7 also fluctuates in accordance with the condition. Slew rate fluctuates in a direction in which the slope of the waveform becomes smaller in the case of condition 1 and in a direction in which the slope of the waveform becomes larger in the case of condition 4. By selecting a suitable slew rate in accordance with the condition, therefore, variations in current can be suppressed even under various conditions.

Third Exemplary Embodiment

Figure 8:
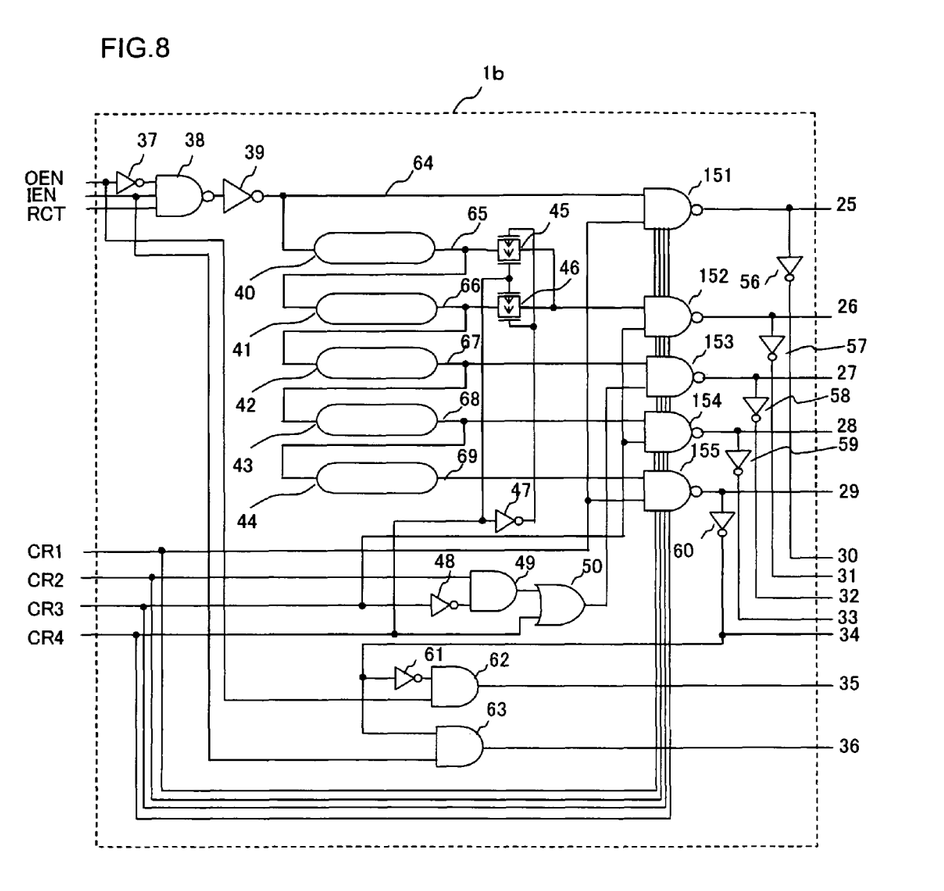
FIG. 8 is a circuit diagram of a control circuit according to a third exemplary embodiment of the present invention.

FIG. 8 is a circuit diagram illustrating a control circuit 1b according to a third exemplary embodiment of the present invention. Components in FIG. 8 identical with those shown in FIG. 5 are designated by like reference characters and need not be described again. The control circuit 1b in FIG. 8 differs from the control circuit of FIG. 2 in that NAND circuits 151 to 155 are provided instead of the 2-input NAND circuits 51 to 55, respectively.

The termination circuit having this configuration is such that the timings at which the terminating resistors are turned on and off are staggered by the delays as illustrated in the first exemplary embodiment and the slew rate is varied as illustrated in the second exemplary embodiment. Accordingly, it is possible to suppress current variations more effectively over a wide range of conditions.

It should be noted that by adopting an arrangement in which the outputs of the inverters 56 to 60 in FIGS. 5 and 8 have their slew rates controlled in a manner similar to that of the NAND circuit 151, it is possible to suppress current variations more effectively.

In the description above, an example is described in which the Thevenin terminating resistor is divided equally into identical resistance values. However, by increasing the types of resistance values rather than performing division equally, it is possible to suppress variations in current at the time of resistor changeover even by controlling the timings at which the high resistors and low resistors are turned on and off. Increasing the types of resistors by using high resistors and low resistors makes even more precise control of resistance values.

Though the present invention has been described in accordance with the foregoing exemplary embodiments, the invention is not limited to these exemplary embodiments and it goes without saying that the invention covers various modifications and changes that would be obvious to those skilled in the art within the scope of the claims.

What is claimed is:

1. A termination circuit comprising:
   an external connection terminal;
   a terminating resistor circuit that includes a plurality of resistance elements, wherein connections of the plurality of resistance elements to the external connection terminal are capable of being turned on and off; and
   a control circuit for exercising control so as to temporally stagger on/off timings of respective ones of said plurality of resistance elements,
   wherein said termination circuit has a plurality of transistors for turning the connections of said plurality of resistance elements to said external terminal on and off,
   wherein said control circuit controls timings at which respective ones of said plurality of transistors are turned on and off by changing slew rates of respective ones of control signals supplied to said plurality of transistors,
   wherein said control circuit has driving circuits, each of which includes a plurality of driving transistors, for driving respective ones of said plurality of transistors; and
   each of said driving circuits varies the slew rate by changing the number of the plurality of driving circuits that are activated.

2. The circuit according to claim 1, wherein said control circuit controls timings at which respective ones of said plurality of transistors are turned on and off by delaying operation of respective ones of said transistors.

3. A buffer circuit equipped with terminating resistors, comprising:
   the termination circuit set forth in claim 1; and
   an input circuit, output circuit or input/output circuit connected to said external connection terminal,
   wherein said control circuit outputs an enable signal to said input circuit, output circuit or input/output circuit after on/off control in each of said plurality of resistance elements is completed.

4. A semiconductor integrated circuit device having the buffer circuit equipped with terminating resistors set forth in claim 3.

5. A semiconductor integrated circuit device having the termination circuit set forth in claim 1.

6. The termination circuit according to claim 1, wherein the control circuit avoids an overlap of switching of on/off timings among each one of the plurality of resistance elements.

7. A termination circuit comprising:
   a control circuit providing a control signal;
   a terminating resistor circuit including a plurality of resistance elements, each one of the plurality of resistance elements being selectively turned on and off according to the control signal from the control circuit; and
   an external connection terminal being connected to the terminating resistor circuit,
   wherein the control circuit provides the control signal to delay on and off timings of respective ones of said plurality of resistance elements,
   wherein the termination circuit includes a plurality of transistors for switching connections of the plurality of resistance elements to the external terminal on and off,
   wherein the control circuit controls timings at which respective ones of said plurality of transistors are turned on and off by changing slew rates of respective ones of control signals supplied to said plurality of transistors,
   wherein said control circuit includes driving circuits, each of which includes a plurality of driving transistors, for driving respective ones of said plurality of transistors, and
   wherein each of said driving circuits varies the slew rate by changing the number of the plurality of driving circuits that are activated.

8. The circuit according to claim 7, wherein the termination circuit includes a plurality of switches for turning connections of the plurality of resistance elements to the external terminal on and off.

9. The circuit according to claim 7, wherein the control circuit controls timings at which respective ones of said plurality of transistors are turned on and off by delaying operation of respective ones of the transistors.

10. A buffer circuit equipped with terminating resistors, comprising:
    the termination circuit set forth in claim 7; and
    an input circuit, output circuit or input/output circuit connected to said external connection terminal,
    wherein said control circuit outputs an enable signal to said input circuit, output circuit or input/output circuit after on/off control in each of said plurality of resistance elements is completed.

11. A semiconductor integrated circuit device having the termination circuit set forth in claim 7.

* * * * *